United States Patent
Liu et al.

(10) Patent No.: US 9,647,127 B2
(45) Date of Patent: May 9, 2017

(54) SEMICONDUCTOR DEVICE AND METHOD FOR MANUFACTURING THE SAME

(71) Applicant: BOE TECHNOLOGY GROUP CO., LTD., Beijing (CN)

(72) Inventors: Xiang Liu, Beijing (CN); Woobong Lee, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/436,309

(22) PCT Filed: Jul. 15, 2014

(86) PCT No.: PCT/CN2014/082218
§ 371 (c)(1),
(2) Date: Apr. 16, 2015

(87) PCT Pub. No.: WO2015/101011
PCT Pub. Date: Jul. 9, 2015

(65) Prior Publication Data
US 2016/0013318 A1    Jan. 14, 2016

(30) Foreign Application Priority Data

Dec. 31, 2013  (CN) .......................... 2013 1 0752120

(51) Int. Cl.
    H01L 29/786    (2006.01)
    H01L 21/02     (2006.01)
    H01L 29/66     (2006.01)

(52) U.S. Cl.
    CPC ...... *H01L 29/7869* (2013.01); *H01L 21/0234* (2013.01); *H01L 21/02323* (2013.01);
    (Continued)

(58) Field of Classification Search
    CPC ................................................ H01L 21/02488
    See application file for complete search history.

(56) References Cited

U.S. PATENT DOCUMENTS 7,087,507 B2     8/2006  Koldiaev et al.
8,530,289 B2 *   9/2013  Yamazaki ..................... 438/161
                         (Continued)

FOREIGN PATENT DOCUMENTS

CN        1713398 A    12/2005
CN        1930668 A     3/2007
                        (Continued)

OTHER PUBLICATIONS

First Office Action regarding Chinese application No. 201310752120.2, dated Jan. 6, 2016. Translation provided by Dragon Intellectual Property Law Firm.
(Continued)

*Primary Examiner* — Eugene Lee
(74) *Attorney, Agent, or Firm* — Harness, Dickey & Pierce, P.L.C.

(57) ABSTRACT

Provided are a semiconductor device and a method for manufacturing the same. The semiconductor device comprises an insulating layer and a metal oxide semiconductor layer which are adjacent to each other, and the insulating layer is formed by steps of: forming a first silicon oxide film; and stabilizing the first silicon oxide film by filling a silicon dangling bond therein with a filling atom capable of being bonded to the silicon dangling bond.

8 Claims, 6 Drawing Sheets

(52) U.S. Cl.
CPC .. *H01L 21/02488* (2013.01); *H01L 21/02554* (2013.01); *H01L 21/02565* (2013.01); *H01L 21/02658* (2013.01); *H01L 29/66969* (2013.01)

(56) References Cited

U.S. PATENT DOCUMENTS

| | | | | |
|---|---|---|---|---|
| 8,546,225 | B2* | 10/2013 | Yamazaki | 438/287 |
| 8,865,534 | B2* | 10/2014 | Yamazaki | 438/158 |
| 9,159,838 | B2* | 10/2015 | Yamazaki et al. | |
| 2007/0202708 | A1* | 8/2007 | Luo | B82Y 10/00 438/758 |
| 2011/0089416 | A1 | 4/2011 | Yamazaki et al. | |
| 2013/0005081 | A1 | 1/2013 | Chen et al. | |
| 2013/0087783 | A1 | 4/2013 | Wang et al. | |
| 2013/0270549 | A1* | 10/2013 | Okazaki | H01L 29/66969 257/43 |

FOREIGN PATENT DOCUMENTS

| | | |
|---|---|---|
| CN | 101523574 A | 9/2009 |
| CN | 102210016 A | 10/2011 |
| CN | 102592974 A | 7/2012 |
| CN | 103325841 A | 9/2013 |
| CN | 103681696 A | 3/2014 |
| CN | 103730373 A | 4/2014 |

OTHER PUBLICATIONS

Written Opinion of the International Searching Authority for international application No. PCT/CN2014/082218.

* cited by examiner

US 9,647,127 B2

1

SEMICONDUCTOR DEVICE AND METHOD FOR MANUFACTURING THE SAME

CROSS-REFERENCE TO RELATED APPLICATION

The present application is the U.S. national phase of PCT Application No. PCT/CN2014/082218 filed on Jul. 15, 2014, which claims priority to Chinese Patent Application No. 201310752120.2 filed on Dec. 31, 2013, the disclosures of which are incorporated in their entirety by reference herein.

TECHNICAL FIELD

The present disclosure relates to the field of semiconductor technology, and in particular, to a semiconductor device and a method for manufacturing the same.

BACKGROUND

In a semiconductor device, amorphous silicon was used previously to manufacture a semiconductor layer; but along with the continuous development of technology and the gradual improvement of requirements for device quality, the amorphous silicon with a relative lower mobility has been unable to meet the requirements for current semiconductor devices. For example, in a current large-sized liquid crystal display, when a drive frequency is 120 Hz, it requires that the mobility should reach 1 cm$^2$/V.S. However, the mobility of a thin film transistor including the semiconductor layer made of the amorphous silicon is generally about 0.5 cm$^2$V.S, which cannot meet the requirements.

In order to meet the above requirements, it has started to use a metal oxide (for example, amorphous IGZO) to manufacture the semiconductor layer. A thin film transistor including the semiconductor layer made of the metal oxide has a high mobility and a good homogeneity, so it can meet the requirements for electronic equipments.

However, the inventors find that the existing thin film transistors including a metal oxide semiconductor layer at least has a defect of unstable performance, which is illustrated as below.

As is well known, the metal oxide can be served as the semiconductor layer because it has a composition with a specific structure; once such structure is damaged, the performance of the metal oxide as the semiconductor layer is adversely influenced. In a semiconductor device, the semiconductor layer is always adjacent to an insulating layer; however, during a process of manufacturing an insulating layer in the prior art, a large amount of silicon dangling bonds are generated at a fractured surface, and these silicon dangling bonds absorb oxygen atoms in the metal oxide, which causes the structure of the metal oxide being as the semiconductor layer to change, thereby to influence the performance of the thin film transistor including the metal oxide semiconductor layer

SUMMARY

An object of the present disclosure is to provide a semiconductor device and a method for manufacturing the same, thereby to improve the stability of the semiconductor device.

In order to achieve the above object, embodiments of the present disclosure provide a method for manufacturing a semiconductor device. The semiconductor device includes an insulating layer and a metal oxide semiconductor layer which are adjacent to each other, in which the insulating layer is formed by steps of:

forming a first silicon oxide film; and stabilizing the first silicon oxide film by filling a silicon dangling bond in the first silicon oxide film with a filling atom capable of being bonded to the silicon dangling bond therein.

Alternatively, the filling atom is an oxygen atom.

Alternatively, the step of stabilizing the first silicon oxide film includes a step of performing plasma treatment on the first silicon oxide film using oxygen-containing plasma.

Alternatively, the oxygen-containing plasma is $O_2$ plasma or $N_2O$ plasma.

Alternatively, the step of stabilizing the first silicon oxide film further includes a step of performing annealing treatment under an oxidizing atmosphere after the plasma treatment.

Alternatively, the semiconductor device is a thin film transistor.

Alternatively, the insulating layer is a gate insulating layer covering a gate electrode of the thin-film transistor or an etch stopping layer covering the metal oxide semiconductor layer.

Alternatively, the step of forming the first silicon oxide film includes: forming a first silicon-rich silicon oxide film, so as to a hydrogen atom released when forming the first silicon-rich silicon oxide film by means of the silicon dangling bond in the first silicon-rich silicon oxide film.

Alternatively, when forming the first silicon-rich silicon oxide film, a ratio of $N_2O$ to $SiH_4$ is greater than 50:1, but less than 100:1.

Alternatively, the method further includes a step of:

forming a second silicon-rich silicon oxide film, wherein the first silicon oxide film is formed on the second silicon-rich silicon oxide film.

In order to achieve the above object, embodiments of the present disclosure further provides a semiconductor device, which includes an insulating layer and a metal oxide semiconductor layer which are adjacent to each other, wherein the insulating layer includes a first silicon oxide film, and a part of silicon atoms in the first silicon oxide film are bonded to a filling atom which is added during stabilization treatment.

Alternatively, the first silicon oxide film is a first silicon-rich silicon oxide film, and the filling atom is an atom which is added during the stabilizing treatment performed on the first silicon-rich silicon oxide film.

Alternatively, the insulating layer further includes a second silicon-rich silicon oxide film, wherein the first silicon oxide film is formed on the second silicon-rich silicon oxide film.

Alternatively, the filling atom is an oxygen atom.

Alternatively, the semiconductor device is a thin film transistor.

Alternatively, the insulating layer is a gate insulating layer covering a gate electrode, or an etch stopping layer or a planarization layer of the thin film transistor.

In the semiconductor device and the method for manufacturing the same according to embodiments of the present disclosure, when manufacturing the insulating layer adjacent to the metal oxide semiconductor layer, stabilization treatment is performed on the first silicon oxide film, by which the silicon dangling bond therein are filled with the filling atom, so as to prevent the first silicon oxide film capturing the oxygen atom from the metal oxide semiconductor layer, and avoid the property of the metal oxide semiconductor layer being changed, thereby to improve the stability of the semiconductor device including the semiconductor layer made of the metal oxide.

DETAILED DESCRIPTION OF THE PREFERRED EMBODIMENTS

In the semiconductor device and the method for manufacturing the same according to embodiments of the present disclosure, when manufacturing an insulating layer adjacent to a metal oxide semiconductor layer, stabilization treatment is performed on the first silicon oxide film, by which a silicon dangling bond therein are filled with a filling atom, so as to prevent the first silicon oxide film capturing the oxygen atom from the metal oxide semiconductor layer, and avoid the property of the metal oxide semiconductor layer being changed, thereby to improve the stability of the semiconductor device including the semiconductor layer made of the metal oxide.

Figure 1:
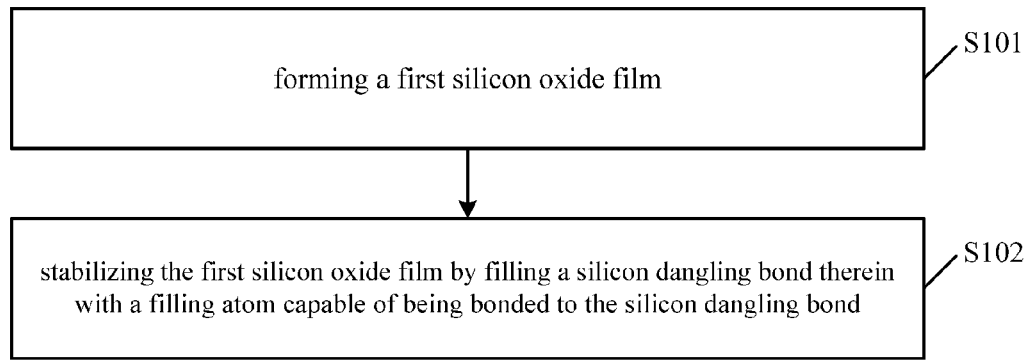
FIG. 1 is a flow chart showing a process for manufacturing an insulating layer by a method for manufacturing a semiconductor device according to an embodiment of the present disclosure.

In a method for manufacturing a semiconductor device according to an embodiment of the present disclosure, the semiconductor device includes an insulating layer and a metal oxide semiconductor layer which are adjacent to each other, as shown in FIG. 1, the insulating layer is formed by steps of:

Step S101: forming a first silicon oxide film; and

Step S102: stabilizing the first silicon oxide film by filling a silicon dangling bond in the first silicon oxide film with a filling atom capable of being bonded to the silicon dangling bond therein.

In an embodiment of the present disclosure, the silicon oxide may be SiO, $SiO_2$, $Si_2O_6$ and the like.

In an embodiment of the present disclosure, the insulating layer and the metal oxide semiconductor layer are adjacent to each other, which means that all or part of the insulating layer are adjacently contacted to the metal oxide semiconductor layer.

In the prior art, when manufacturing a silicon oxide insulating layer, as each silicon atom always needs to bond to more oxygen atoms to form a stable structure, thus a large amount of silicon dangling bonds are formed at the fractured surface of the silicon oxide insulating layer, and these silicon dangling bonds capture the oxygen atoms in the metal oxide to form a stable structure, and the structure of the metal oxide semiconductor layer are damaged, thereby to adversely affect the semiconductor performance thereof.

However, in the method according to embodiments of the present disclosure, stabilization treatment is performed on a silicon oxide insulating layer after being initially formed, by means of filling the silicon dangling bond with the filling atom, so as to form a stable structure. Thus, the silicon oxide insulating layer according to embodiments of the present disclosure no longer capture the oxygen atoms in the metal oxide, thereby to prevent the structure of the metal oxide semiconductor layer being damaged, thereby to improve the stability of the semiconductor device including the semiconductor layer made of the metal oxide.

Figure 2:
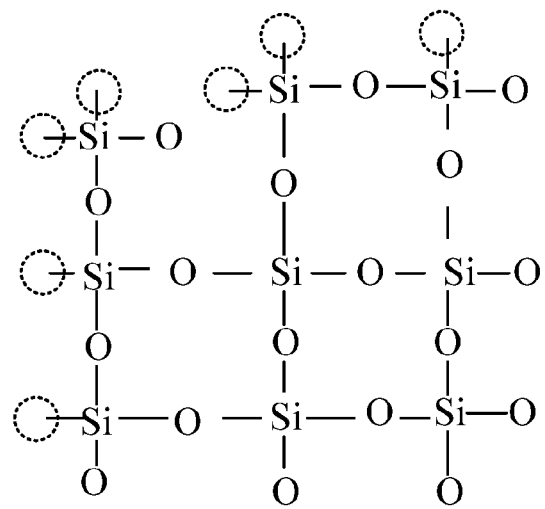
FIG. 2 is a schematic view showing an interface of a growing silicon oxide film in the prior art.

As shown in FIG. 2, a schematic view showing an interface of a growing silicon oxide film grown in the prior art, it may be found that a large amount of the dangling bonds are formed at the interface when the silicon oxide film grows, as shown by the dashed circle in the drawing.

Figure 3:
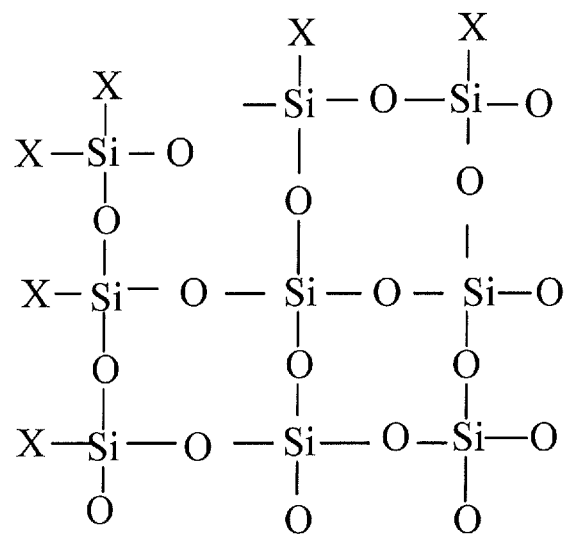
FIG. 3 is a schematic view showing an interface of a silicon oxide film of which silicon dangling bonds are filled with X atoms according to an embodiment of the present disclosure.

As shown in FIG. 3, a schematic view showing an interface of a silicon oxide film after being performed with stabilization treatment by the method according to an embodiment of the present disclosure, it may be found that all of the silicon dangling bonds in FIG. 2 are occupied with the X atoms, so as to form a stable structure with silicon atoms, thus these silicon dangling bonds no longer capture the oxygen atoms in the metal oxide.

In an embodiment of the present disclosure, the X atom may be various atoms that can bond to the silicon dangling bond to form a stable bond, for example, an oxygen atom, a sulphur atom, a hydrogen atom and the like, of which no detailed illustrations are given one by one herein.

However, in consideration of the stability of binding and the maturation of the manufacturing process, in an embodiment of the present disclosure, the filling atom is an oxygen atom.

Moreover, the silicon dangling bond may be filled with the oxygen atom in various modes. In an embodiment of the present disclosure, the step of stabilizing the first silicon oxide film includes a step of performing plasma treatment on the first silicon oxide film using oxygen-containing plasma.

The oxygen-containing plasma may be $O_2$ plasma or $N_2O$ plasma and the like.

Embodiments of the present disclosure may also include other processes under an oxidizing atmosphere, for bonding the oxygen atom to the silicon dangling bond.

Plasma is an ionized gasiform matter consisting of atoms, of which a part of electrons are deprived, and positive and negative electrons generated by ionizing atomic groups. The oxygen atoms contained in the $O_2$ plasma or the $N_2O$ plasma and the like bond to the silicon dangling bond to form a stable Si—O bond.

At the same time, in the silicon oxide insulating layer which is formed initially, a part of Si—O bonds are in an unstable state, and such an unstable state may be damaged at any moment to form a new silicon dangling bond. In an embodiment of the present disclosure, when the plasma treatment is performed on the first silicon oxide film which is formed initially, the energy of the plasma can break these unstable Si—O bonds, and then new silicon dangling bonds formed may bond to the oxygen atom in the $O_2$ plasma or the $N_2O$ plasma, thereby to form a new stable Si—O bond.

Figure 4:
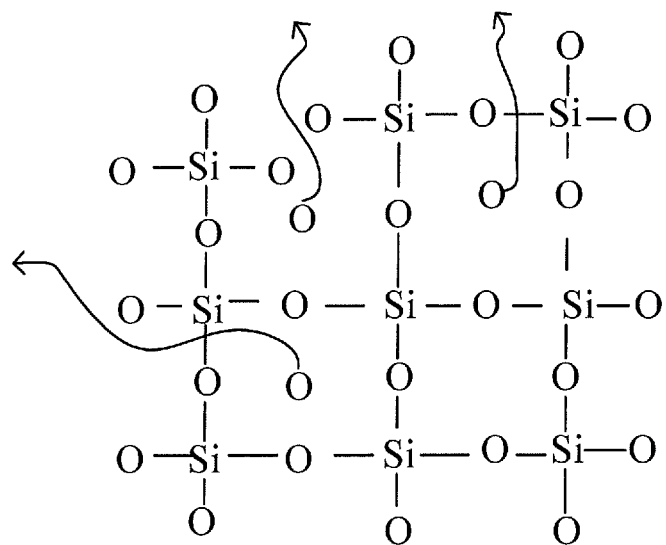
FIG. 4 is a schematic view showing an interface of a silicon oxide film of which silicon dangling bonds are filled with oxygen atoms according to an embodiment of the present disclosure.

After the above steps, as shown in FIG. 4, a schematic view showing an interface of a first silicon oxide film after being performed with stabilization treatment by the method according to an embodiment of the present disclosure, and it may be found that the silicon dangling bond no longer exists.

It should be noted that the above-mentioned shows an ideal situation, and in the embodiments of the present disclosure, it is not required that all of the silicon dangling bonds should be filled. Comparing to the prior art, the possibility that the silicon oxide insulating layer captures oxygen atoms from a metal oxide may be lowered so long as a part of the silicon dangling bonds are filled, so that the performance of the metal oxide semiconductor layer may be more stable than that of the prior art.

In other words, in embodiments of the present disclosure, the expression of "filling a silicon dangling bond in the silicon oxide film with a filling atom capable of being bonded to the silicon dangling bond therein" does not necessarily mean that all of the silicon dangling bonds should be filled, instead, it may that a part of the silicon dangling bonds are filled, or all of the silicon dangling bonds are filled.

In an embodiment of the present disclosure, it may use any other modes to fill the silicon dangling bonds with atoms, for example, an ion injection mode, which injects ions (capable of being bonded to the silicon dangling bond) to the first silicon oxide film which is initially formed, may also achieve the above object of filling the silicon dangling bond with atoms.

Furthermore, in conjunction with FIG. 4, in an embodiment of the present disclosure, after the plasma treatment, a part of free oxygen atoms may exist in the first silicon oxide insulating layer inevitably, and these free oxygen atoms may have a certain influence on the whole device during subsequent processes or using the semiconductor device.

In order to lower such possibility and further improve the stability of the semiconductor device, in an embodiment of the present disclosure, subsequent to the above plasma treatment, the method further includes a step of performing annealing treatment, so as to remove the free oxygen atoms in the first silicon oxide film (as shown in FIG. 4).

When other matters are injected into the insulating layer, an incident matter with high energy collides with atoms in the silicon oxide network, so that some atoms are shifted, so as to generate a large amount of holes, thereby to break the unstable Si—O bond. In such case, by means of the annealing treatment under the oxidizing atmosphere, the oxygen atoms in the plasma can better enter into the holes and better bond to the silicon dangling bonds, thereby to improve the stability of the silicon oxide insulating layer formed finally.

The method according to embodiments of the present disclosure may be applied to various semiconductor devices including a semiconductor layer, for example, thin film transistor (TFT), metal oxide semiconductor field effect transistor (MOSFET) and the like.

When the method according to embodiments of the present disclosure is applied to a thin film transistor, the above insulating layer may be a gate insulating layer of the thin film transistor.

In an embodiment of the present disclosure, there may be various metal oxides that can be used for manufacturing a semiconductor layer. At present, an indium gallium zinc oxide (IGZO) semiconductor with an amorphous structure is often used.

At present, the metals for manufacturing source/drain electrodes, for example, Mo, Al and the like, is usually etched by an acid solution; however, the amorphous IGZO is very easily to be etched by the acid solution, thus the metal oxide semiconductor layer may be eroded when the source/drain metal film is etched to form the source/drain electrodes. In order to solve the above problem, an etch stopping layer is usually added on the metal oxide semiconductor layer, so as to protect the metal oxide semiconductor layer from being eroded by the etching solution for the source/drain metal.

Therefore, in an embodiment of the present disclosure, the insulating layer may also be the above etch stopping layer.

The insulating layer may also be a planarization layer which covers the whole thin film transistor.

Figure 5:
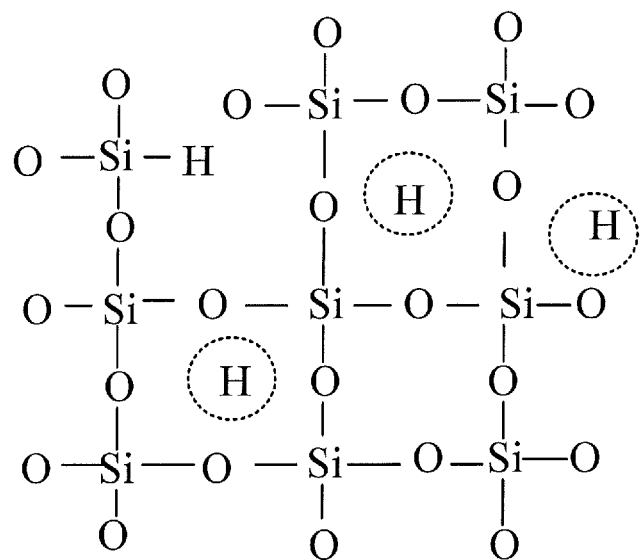
FIG. 5 is a schematic view showing free hydrogen atoms in a growing silicon oxide film in the prior art.

At present, a silicon oxide film is usually manufactured using $SiH_4$ gas and $N_2O$ gas via plasma-enhanced chemical vapour deposition (PECVD). The silicon oxide film formed thereby contains free hydrogen atoms, as shown in FIG. 5, generally between 3% to 10%.

Moreover, these hydrogen atoms may be absorbed by the metal oxide semiconductor layer, thereby to change the structure of the metal oxide semiconductor layer, and to influence the performance of the semiconductor device.

In an embodiment of the present disclosure, in order to alleviate the influence of these free hydrogen atoms on the metal oxide semiconductor layer, the step of forming the first silicon oxide film includes: forming a first silicon-rich silicon oxide film, so as to absorb a hydrogen atom released when forming the first silicon-rich silicon oxide film by means of the silicon dangling bond in the first silicon-rich silicon oxide film.

Figure 6:
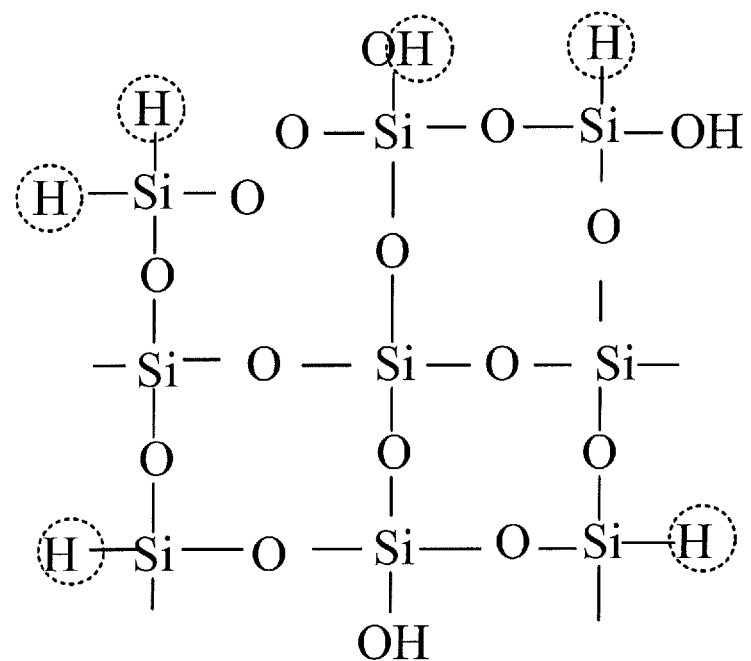
FIG. 6 is a schematic view showing a silicon oxide film absorbed with free hydrogen atoms according to an embodiment of the present disclosure.

FIG. 6 is a schematic view showing a first silicon-rich silicon oxide film formed by a method according to an embodiment of the present disclosure, it may be found that these free hydrogen atoms are absorbed by the silicon dangling bonds, so as to form a stable structure, thereby to prevent these free hydrogen atoms being absorbed by the metal oxide semiconductor layer, and to avoid the performance of the metal oxide semiconductor layer being adversely influenced, therefore the stability of the semiconductor device can be improved.

As mentioned above, in an embodiment of the present disclosure, the first silicon oxide film may be a first silicon-rich silicon oxide film (for example, the first silicon-rich silicon oxide may be silicon-rich silicon dioxide), that is, in the method according to embodiments of the present disclosure, the stabilization treatment may be directly performed on the first silicon-rich silicon oxide film, thereby to form a stable structure at the surface of the first silicon-rich silicon oxide film (for example, the stable structure may be oxygen-rich silicon dioxide).

In an embodiment of the present disclosure, the first silicon oxide film may also be an ordinary silicon oxide film (for example, the ordinary silicon oxide may be silicon dioxide) formed on a second silicon-rich silicon oxide film, thereby to perform the stabilization treatment on the ordinary silicon oxide film. In such mode, the method for manufacturing a semiconductor device according to an embodiment of the present disclosure includes:

forming a second silicon-rich silicon oxide film (for example, the second silicon-rich silicon oxide may be silicon-rich silicon dioxide);

forming the first silicon oxide film on the second silicon-rich silicon oxide film (for example, the first silicon oxide may be silicon dioxide); and stabilizing the first silicon oxide film by filling the silicon dangling bonds in the first silicon oxide film with filling atoms capable of being bonded to the silicon dangling bonds in the first silicon oxide film (for example, the filling atoms may be oxygen atoms), thereby to form a stable structure at the surface of the first silicon oxide film (for example, the stable structure may be oxygen-rich silicon dioxide).

Specifically, the method for manufacturing a semiconductor device includes:

forming a silicon-rich silicon dioxide film;
forming a silicon dioxide film on the silicon-rich silicon dioxide film; and
stabilizing the silicon dioxide film by filling the silicon dangling bonds in the silicon dioxide film with oxygen atoms capable of being bonded to the silicon dangling bonds in the silicon dioxide film, thereby to form oxygen-rich silicon dioxide with a stable structure at the surface of the silicon dioxide film.

At the same time, embodiments of the present disclosure further provide a semiconductor device, which includes an insulating layer and a metal oxide semiconductor layer which are adjacent to each other, in which the insulating layer includes a first silicon oxide film, a part of silicon atoms in the first silicon oxide film are bonded to filling atoms, and the filling atoms are used to maintain the first silicon oxide film stable.

Specifically, the first silicon oxide film may be silicon dioxide, and the filling atom may be nitrogen (N), hydrogen (H), oxygen (O) or sulphur (S); for example, when the filling atom is an oxygen atom, a stable oxygen-rich silicon dioxide is formed at the surface of the silicon dioxide.

The first silicon oxide film is a first silicon-rich silicon oxide film (for example, the first silicon-rich silicon oxide may be silicon-rich silicon dioxide), and the filling atom (the filling atom may be H, N, O or S) is the atom which is added during the stabilization treatment performed on the first silicon-rich silicon oxide film.

The insulating layer further includes a second silicon-rich silicon oxide film (for example, the second silicon-rich silicon oxide may be silicon-rich silicon dioxide), and the first silicon oxide film (for example, the first silicon oxide may be silicon dioxide) is formed on the second silicon-rich silicon oxide film. For example, when the filling atom is an oxygen atom, a film with a stable structure, which is formed during the stabilization treatment, is formed at the surface of the first silicon oxide film (for example, the film with the stable structure may be an oxygen-rich silicon dioxide film)

The filling atom is an oxygen atom.

The semiconductor device is a thin film transistor.

The insulating layer is a gate insulating layer or an etch stopping layer or a planarization layer of the thin film transistor.

As mentioned above, in embodiments of the present disclosure, the semiconductor device may be a TFT, and more detailed illustrations are given below by taking an example of applying the TFT to an array substrate of a liquid crystal display by the above process.

In a display panel using Advanced Super Dimension Switch technology, by means of a multidimensional electric field formed by an electric field generated at the edge of slot electrodes in the same plane and an electric field generated between a slot electrode layer and a plate electrode layer, all of alignment liquid crystal molecules between the slot electrodes and above the electrodes in the liquid crystal cells can be rotated, thereby to increase the light transmission efficiency, and improve the working efficiency of the liquid crystal.

A process of manufacturing an array substrate by the method according to embodiments of the present disclosure is illustrated below, which includes:

Step S1: a gate metal film having a certain thickness (for example, 2000-5000 Å) is formed on a transparent substrate 1 via sputtering or heat evaporation. The gate metal film may be formed of one or more metals selected from Cr, W, Ti, Ta and Mo, and the like, and the gate metal film may have a single-layer structure or a multilayer structure.

Figure 7A:
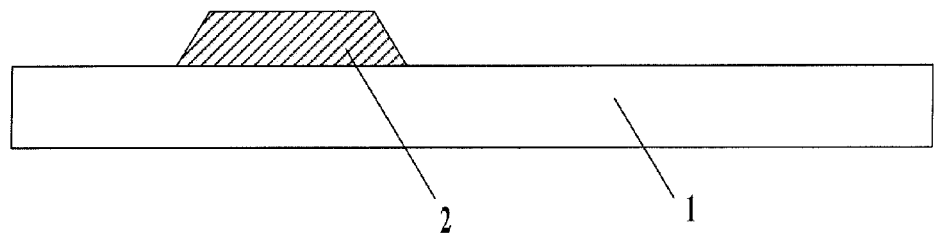
FIGS. 7*a*-7*h* are schematic views showing a method for manufacturing an array substrate by a method according to an embodiment of the present disclosure.

Step S2: a gate electrode 2 as shown in FIG. 7a and a gate electrode scanning line (not shown) are formed via a single patterning process.

Figure 7B:
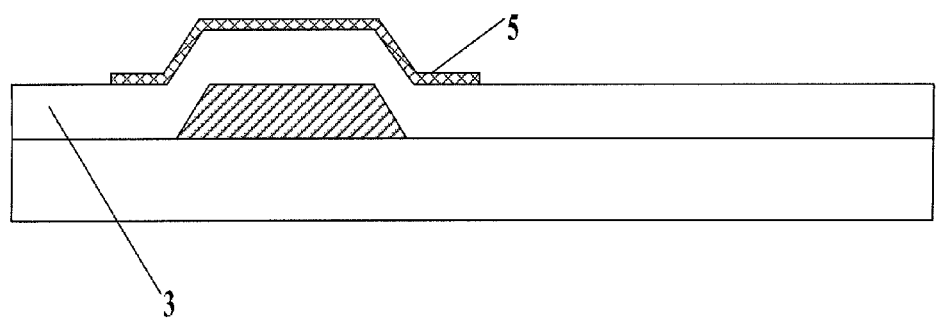

Step S3: a gate insulating layer 3 having a certain thickness (for example, 2000-5000 Å) is formed on the substrate as shown in FIG. 7a, as shown in FIG. 7b.

The gate insulating layer 3 may be formed via PECVD.

In an embodiment of the present disclosure, the gate insulating layer 3 may be a single-layer silicon oxide layer, or it may have a double-layer structure of a silicon oxide layer and a silicon nitride layer from top to bottom, or it may have a triple-layer structure of a silicon oxide layer (the corresponding reacting gas is $N_2O$ and $SiH_4$), a silicon oxynitride layer (the corresponding reacting gas is $N_2O$, $SiH_4$, $NH_3$ and $N_2$) and a silicon nitride layer (the corresponding reacting gas is $SiH_4$, $NH_3$ and $N_2$, or $SiH_2Cl_2$, $NH_3$ and $N_2$) from top to bottom.

In an embodiment of the present disclosure, the silicon oxide layer may have a single-layer structure or a double-layer structure.

When the silicon oxide layer has a double-layer structure, a silicon-rich silicon oxide layer is firstly formed on the transparent substrate 1, which contains a large amount of silicon dangling bonds to absorb the hydrogen atoms appearing in the silicon oxide layer manufactured using $N_2O$ and $SiH_4$, thereby to avoid the metal oxide semiconductor layer subsequently formed from being adversely affected.

The number of the silicon dangling bonds in the silicon-rich silicon oxide layer may be controlled by adjusting the reaction ratio of the gas, and when a silicon-rich silicon oxide layer is formed, the ratio of $N_2O$ to $SiH_4$ should be greater than 50:1, and in consideration of the insulating performance of the silicon-rich silicon oxide layer, the ratio of $N_2O$ to $SiH_4$ should be less than 100:1.

Then, the surface of the silicon-rich silicon oxide layer formed initially is modified via stabilization treatment, by means of filling the silicon dangling bonds therein with oxygen atoms (the process thereof has been described in details above, and it will not be repeated herein), so that the upper part of the silicon-rich silicon oxide layer formed initially becomes an oxygen-rich silicon oxide layer, thereby to obtain a two-layer structure.

Finally, the Si—O bond in the oxygen-rich silicon oxide layer is further stabilized via an annealing process.

Additionally, for the double-layer structure of the silicon oxide layer, a silicon-rich silicon oxide layer 32 is firstly formed, and a silicon oxide layer is secondly formed on the silicon-rich silicon oxide layer, and then stabilization treatment is performed on the surface of the silicon oxide layer, so as to form a stable oxygen-rich silicon oxide layer 31 on the surface of the silicon oxide layer; for the single-layer structure of the silicon oxide layer, a silicon oxide layer is firstly formed on the substrate directly, and an oxygen-rich silicon oxide layer is formed after being performed with stabilization treatment at the surface of the silicon oxide layer. The above oxygen-rich silicon oxide layer may prevent the silicon oxide layer capturing the oxygen of the metal oxide semiconductor layer, thereby to avoid influencing the performance of the thin film transistor, thus the stability of the thin film transistor can be guaranteed.

Step S4: a metal oxide semiconductor film having a certain thickness (for example, 50-1000 Å) is formed, and then a metal oxide semiconductor layer 5 is formed via a single photoetching process, as shown in FIG. 7b.

In this step, the metal oxide semiconductor film 5 is formed via sputtering, and the metal oxide semiconductor film 5 may be formed of amorphous IGZO, HIZO, IZO, a-InZnO, a-InZnO, ZnO:F, $In_2O_3$:Sn, $In_2O_3$:Mo, $Cd_2SnO_4$, ZnO:Al, $TiO_2$:Nb, Cd—Sn—O or other metal oxides.

Figure 7C:
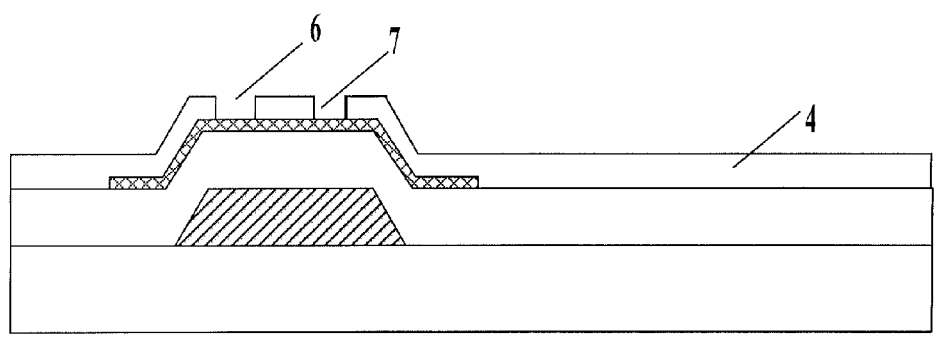

Step S5: an etch stopping film having a certain thickness (for example, 500-3000 Å) is formed on the substrate as shown in FIG. 7b, and the etch stopping film 4 is patterned, so as to form a drain electrode contact hole 6 and a source electrode contact hole 7, as shown in FIG. 7c.

In an embodiment of the present disclosure, the etch stopping film 4 may be a single-layer silicon oxide layer, or a double-layer structure of a silicon oxide layer and a silicon nitride layer from top to bottom, or a triple-layer structure of a silicon oxide layer (the corresponding reacting gas is $N_2O$ and $SiH_4$), a silicon oxynitride layer (the corresponding reacting gas is $N_2O$, $SiH_4$, $NH_3$ and $N_2$) and a silicon nitride layer (the corresponding reacting gas is $SiH_4$, $NH_3$ and $N_2$, or $SiH_2Cl_2$, $NH_3$ and $N_2$) from top to bottom.

In an embodiment of the present disclosure, the silicon oxide layer may have a single-layer structure or a double-layer structure.

When the silicon oxide layer has a double-layer structure, a silicon-rich silicon oxide layer is firstly formed on the transparent substrate 1, which contains a large amount of silicon dangling bonds to absorb the hydrogen atoms appearing in the silicon oxide layer manufactured using $N_2O$ and $SiH_4$, thereby avoid the metal oxide semiconductor layer subsequently formed from being adversely affected.

The number of the silicon dangling bonds in the silicon-rich silicon oxide layer may be controlled by adjusting the reaction ratio of the gas, and when a silicon-rich silicon oxide layer is formed, the ratio of $N_2O$ to $SiH_4$ should be greater than 50:1, and in consideration of the insulating performance of the silicon-rich silicon oxide layer, the ratio of $N_2O$ to $SiH_4$ should be less than 100:1.

Then, the surface of the silicon-rich silicon oxide layer formed initially is modified via stabilization treatment, by means of filling the silicon dangling bonds therein with oxygen atoms (the process thereof has been described in details above, and it will be not repeated herein), so that the upper part of the silicon-rich silicon oxide layer formed initially becomes an oxygen-rich silicon oxide layer, thereby to obtain a two-layer structure.

Finally, the Si—O bond in the oxygen-rich silicon oxide layer is further stabilized via an annealing process The etch stopping layer 4 may also be manufactured using other materials, for example, $Al_2O_3$, and the like, which is not be illustrated one by one herein.

Figure 7D:
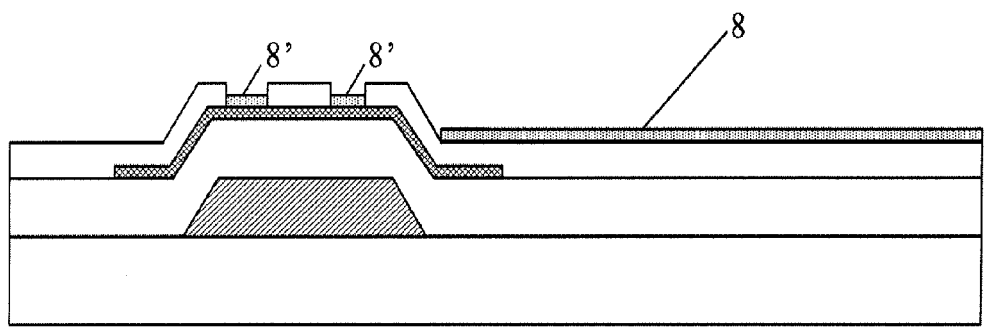

Step S6: a transparent conducting film having a certain thickness (for example, 100-2000 Å) is formed on the substrate as shown in FIG. 7c, and a transparent common electrode 8 and a transparent conductive electrode 8' is formed via a patterning process, as shown in FIG. 7d.

The transparent conducting film may be ITO or IZO, or other transparent metal oxide.

Figure 7E:
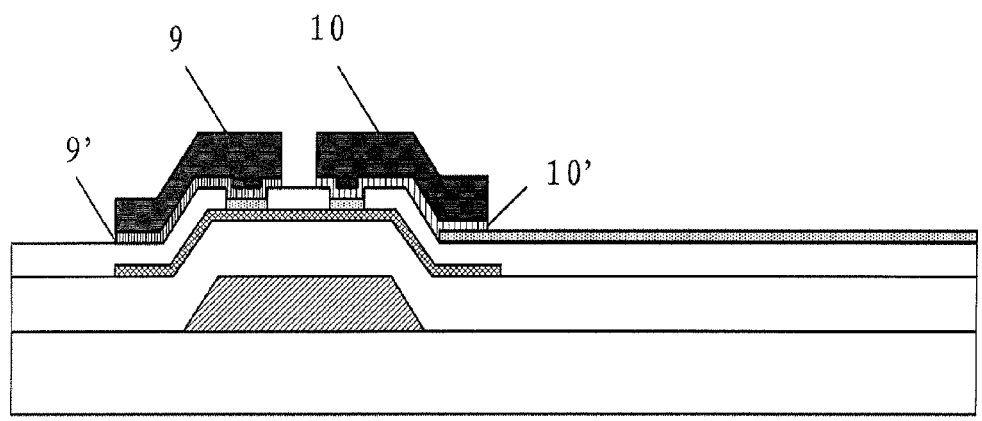

Step S7: a source/drain metal film is formed on the substrate as shown in FIG. 7d, and a drain electrode 9, a source electrode 10 and a data scanning line (not shown) via a patterning process, as shown in FIG. 7e;

The source/drain metal film may be made of a metal such as Cr, W, Ti, Ta, Mo and the like or an alloy thereof, and the source/drain metal film may also have a single-layer structure or a multilayer structure, for example, drain electrode layers 9 and 9', and source electrode layers 10 and 10'. The drain electrode 9, the source electrode 10 and the data scanning line are formed via a single photoetching process.

Figure 7F:
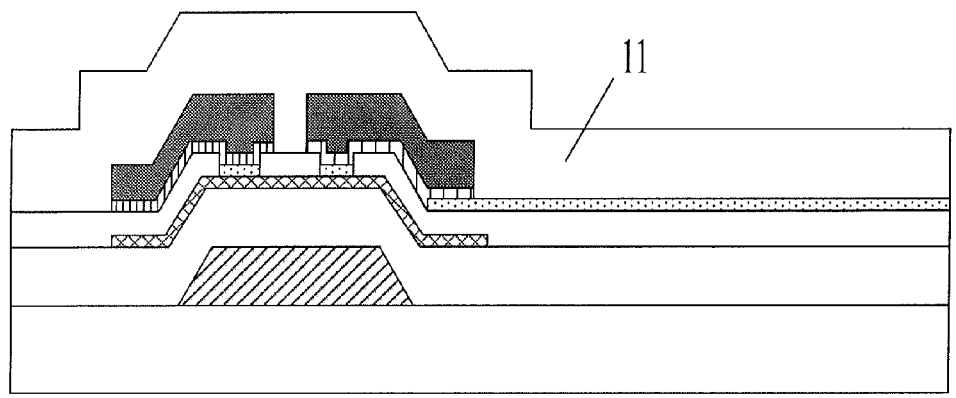

Step S8: a planarization layer 11 having a certain thickness (for example, 2000-10000 Å) is formed on the substrate as shown in FIG. 7e, as shown in FIG. 7f;

The process of manufacturing the planarization layer 11 is same as that of the gate insulating layer 3 and etch stopping layer 4, and it is not described again herein.

Figure 7G:
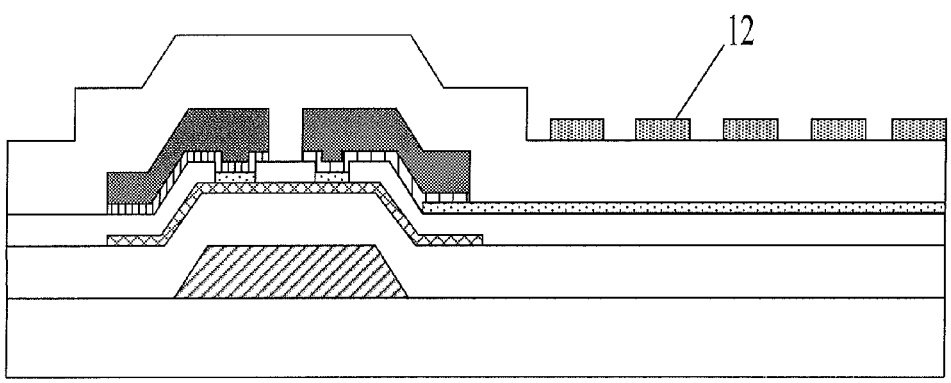
Figure 7H:
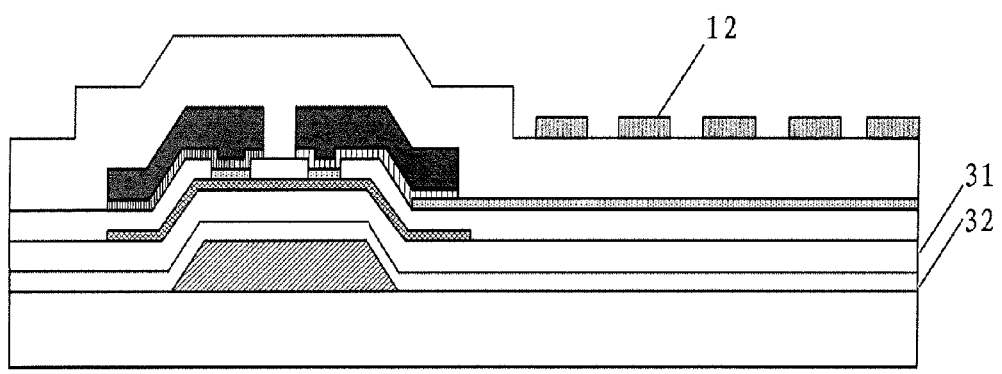

Step S9: a transparent conducting film having a certain thickness (for example, 300-1500 Å) is formed on the substrate as shown in FIG. 7f, and a pixel electrode 12 is formed via a photoetching process, as shown in FIG. 7g.

The transparent conducting film may be formed by various modes, for example, sputtering or heat evaporation, and the like.

The transparent conducting film may be formed of ITO, IZO, or other transparent metal oxides.

Then, the process for manufacturing the array substrate is substantially accomplished.

The above descriptions show some preferred embodiments of the disclosure. It should be pointed out that, for one of ordinary skills in the art, various improvements and modifications may be made without departing from the principles of the disclosure, and these improvements and modifications should be construed as pertaining the protection scope of the disclosure.

What is claimed is:

1. A method for manufacturing a semiconductor device, the semiconductor device comprising an insulating layer and a metal oxide semiconductor layer which are adjacent to each other, wherein the insulating layer is formed by steps of:
   forming a first silicon oxide film; and
   stabilizing the first silicon oxide film by filling a silicon dangling bond in the first silicon oxide film with a filling atom capable of being bonded to the silicon dangling bond therein,
   wherein the step of stabilizing the first silicon oxide film further comprises a step of performing annealing treatment under an oxidizing atmosphere after the plasma treatment to remove free oxygen atoms in the insulating layer, and
   wherein the filling atom is an oxygen atom.

2. The method according to claim 1, wherein the step of stabilizing the first silicon oxide film comprises a step of performing plasma treatment on the first silicon oxide film using oxygen-containing plasma.

3. The method according to claim 2, wherein the oxygen-containing plasma is $O_2$ plasma or $N_2O$ plasma.

4. The method according to claim 1, wherein the semiconductor device is a thin film transistor.

5. The method according to claim 4, wherein the insulating layer is a gate insulating layer or an etch stopping layer or a planarization layer of the thin film transistor.

6. The method according to claim 5, wherein the step of forming the first silicon oxide film comprises:
   forming a first silicon-rich silicon oxide film, so as to absorb a hydrogen atom released when forming the first silicon-rich silicon oxide film by means of the silicon dangling bond in the first silicon-rich silicon oxide film.

7. The method according to claim 6, wherein when forming the first silicon-rich silicon oxide film by using $SH_4$ gas and $N_2O$ gas, a ratio of $N_2O$ to $SiH_4$ is greater than 50:1, but less than 100:1.

8. The method according to claim 1, further comprising a step of:

forming a second silicon-rich silicon oxide film, wherein the first silicon oxide film is formed on the second silicon-rich silicon oxide film.

* * * * *